United States Patent
Yamasaki et al.

(10) Patent No.: US 11,900,332 B2
(45) Date of Patent: Feb. 13, 2024

(54) SYSTEM FOR MANAGING VEHICLE BATTERY REPLACEMENT

(71) Applicant: TOYOTA JIDOSHA KABUSHIKI KAISHA, Toyota (JP)

(72) Inventors: Hiroshi Yamasaki, Toyota (JP); Juni Yasoshima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 154 days.

(21) Appl. No.: 17/234,972

(22) Filed: Apr. 20, 2021

(65) Prior Publication Data

US 2021/0374816 A1  Dec. 2, 2021

(30) Foreign Application Priority Data

Jun. 2, 2020 (JP) ................................. 2020-096162

(51) Int. Cl.
*G06Q 10/20* (2023.01)
*G01R 31/392* (2019.01)
*G06Q 30/0207* (2023.01)
*G06Q 30/0601* (2023.01)

(52) U.S. Cl.
CPC ........... *G06Q 10/20* (2013.01); *G01R 31/392* (2019.01); *G06Q 30/0207* (2013.01); *G06Q 30/0611* (2013.01)

(58) Field of Classification Search
CPC ....................... G06Q 10/20; G06Q 30/0207
See application file for complete search history.

(56) References Cited

U.S. PATENT DOCUMENTS 6,091,325 A * 7/2000 Zur .......................... H02J 7/14
340/661
8,996,241 B2 * 3/2015 Uchida ............... H01M 10/425
701/29.6
(Continued)

FOREIGN PATENT DOCUMENTS

CN 102529742 A * 7/2012
CN 108394295 A 8/2018
(Continued)

OTHER PUBLICATIONS

Failure Warning at the End of Service-Life of Lead-Acid Batteries for Backup Applications. Wang, Wubin; Yao, Wenxi; Chen, Wei; Chen, Dong; Lu, Zhengyu. Applied Sciences 10.17: 5760. MDPI AG. (2020) (Year: 2020).*

(Continued)

*Primary Examiner* — Michael Misiaszek
(74) *Attorney, Agent, or Firm* — Oliff PLC

(57) ABSTRACT

A server includes a management information DB that stores management information indicating whether or not each of a plurality of vehicles falls under a subject vehicle for which battery replacement timing is managed. An information processing apparatus of the server includes an estimator that estimates a degree of deterioration of a secondary battery mounted on the subject vehicle based on history information showing history of use of the secondary battery mounted on the subject vehicle and a notification unit that transmits a battery replacement alarm (a notification signal that gives a notification about battery replacement timing of the subject vehicle) when the estimated degree of deterioration of the secondary battery reaches a prescribed threshold value.

9 Claims, 10 Drawing Sheets

(56) References Cited

U.S. PATENT DOCUMENTS

| | | | |
|---|---|---|---|
| 2007/0029974 A1* | 2/2007 | Uchida | G01R 31/3842 320/132 |
| 2011/0050239 A1* | 3/2011 | Hoshino | G06Q 30/06 324/435 |
| 2012/0078645 A1* | 3/2012 | Drew | G06Q 30/02 705/1.1 |
| 2015/0127479 A1* | 5/2015 | Penilla | B60L 53/68 705/305 |
| 2016/0275727 A1* | 9/2016 | Kurimoto | H01M 10/4207 |
| 2016/0371789 A1* | 12/2016 | Kelley | G06Q 40/08 |
| 2018/0222343 A1 | 8/2018 | Uchida | |
| 2019/0152328 A1 | 5/2019 | Igata et al. | |
| 2019/0176639 A1* | 6/2019 | Kumar | B60L 3/0046 |
| 2020/0326382 A1 | 10/2020 | Matsumura et al. | |
| 2021/0123975 A1* | 4/2021 | Sarwat | G01R 31/3648 |
| 2021/0148989 A1* | 5/2021 | Malloy | B60L 58/16 |
| 2021/0367277 A1 | 11/2021 | Takechi | |

FOREIGN PATENT DOCUMENTS

| | | |
|---|---|---|
| EP | 2 629 109 A1 | 8/2013 |
| JP | 2014-123393 A | 7/2014 |
| JP | 2017-134894 A | 8/2017 |
| JP | 2018-205873 A | 12/2018 |
| JP | 2019-095966 A | 6/2019 |
| JP | WO2019/131825 A1 | 1/2021 |
| WO | 2019/131825 A1 | 7/2019 |
| WO | 2019/230069 A1 | 12/2019 |

OTHER PUBLICATIONS

Fujitsu and RESC Begin Collaboration to Build the Future of Electric Vehicles, Integrating ICT with Energy. JCN Newswire—Japan Corporate News Network [Tokyo] Oct. 3, 2013. (Year: 2013).*

Tesla shows off its battery-swapping station: 90 seconds and less than $100: Stations would give drivers choice between fast or free? Contra Costa Times [Walnut Creek, Calif] Jun. 22, 2013: B.7. (Year: 2013).*

"NIO has proposed the BaaS concept as the key factor of the battery electric vehicle industry, but is the BaaS concept useful." https://www.xianjichina.com /special/detail_438159.html.

Partial English Translation of Sep. 23, 2023 Office Action issued in Chinese Patent Application No. 202110609641.7.

* cited by examiner

FIG.7

《MANAGEMENT INFORMATION》

| VEHICLE ID | CONTRACT INFORMATION | | | | |
|---|---|---|---|---|---|
| | VEHICLE | BATTERY | BATTERY REPLACEMENT | THRESHOLD VALUE | .... |
| ID-1 | MODEL X | USED | AGREED | Th1 | .... |
| ID-2 | MODEL Y | NEW | NOT AGREED | — | .... |
| ID-3 | MODEL X | USED | AGREED | ThX | .... |
| ID-4 | MODEL Z | NEW | AGREED | Th2 | .... |
| ⋮ | ⋮ | ⋮ | ⋮ | ⋮ | .... |

SYSTEM FOR MANAGING VEHICLE BATTERY REPLACEMENT

This nonprovisional application is based on Japanese Patent Application No. 2020-096162 filed with the Japan Patent Office on Jun. 2, 2020, the entire contents of which are hereby incorporated by reference.

BACKGROUND

Field

The present disclosure relates to a management apparatus that manages a secondary battery mounted on a vehicle and a vehicle sales system.

Description of the Background Art

Japanese Patent Laying-Open No. 2014-123393 discloses an apparatus that assists proper evaluation of value of a secondary battery in each of a scene before the secondary battery is leased, a scene in which the secondary battery is under lease, and a scene after end of lease of the secondary battery.

SUMMARY

With the apparatus described in Japanese Patent Laying-Open No. 2014-123393, the value of the leased secondary battery tends to more properly be evaluated. Such an apparatus facilitates lease of the secondary battery to a user of a vehicle for a proper fee. At the moment, however, a proportion of users who use used batteries in vehicles is low. Reuse of used batteries that were used in vehicles has also been insufficient.

The present disclosure was made to solve problems above, and an object thereof is to provide a management apparatus and a vehicle sales system that can promote effective use of used batteries that are usable in vehicles.

A management apparatus according to a first point of view of the present disclosure includes a storage that stores management information indicating whether or not each of a plurality of vehicles falls under a subject vehicle for which battery replacement timing is managed, an estimator that estimates a degree of deterioration of a secondary battery mounted on the subject vehicle based on history information showing history of use of the secondary battery mounted on the subject vehicle, and a notification unit that transmits a notification signal indicating battery replacement timing of the subject vehicle when the estimated degree of deterioration reaches a prescribed threshold value.

The notification unit of the management apparatus transmits a notification signal indicating battery replacement timing of the subject vehicle when the degree of deterioration of the secondary battery estimated by the estimator reaches the prescribed threshold value. The estimator of the management apparatus can estimate the degree of deterioration of the secondary battery mounted on the subject vehicle based on the history information of the subject vehicle. A rate of deterioration of the battery varies depending on how the battery is used. Since the estimator can know how the battery is used in the subject vehicle from the history information of the subject vehicle, it can relatively highly accurately find the degree of deterioration of the secondary battery mounted on the subject vehicle. The management apparatus can notify the user of the subject vehicle of battery replacement timing of the subject vehicle through the notification signal. The notification signal may directly be transmitted from the management apparatus to the user of the subject vehicle. Alternatively, the notification signal may be transmitted from the management apparatus to a prescribed terminal and the prescribed terminal that has received the notification signal may notify the user of the subject vehicle of battery replacement timing of the subject vehicle.

The battery replacement timing indicated to the user may be timing close to expiration of battery life (for example, a period during which the secondary battery is usable in the subject vehicle). According to such a configuration, the user of the vehicle can use the secondary battery until immediately before expiration of battery life.

The battery replacement timing indicated to the user may be timing at which a battery leasing company desires to collect a secondary battery (for example, timing before deterioration of the secondary battery mounted on the subject vehicle to such an extent as being unusable in a prescribed application). When the user of the subject vehicle agrees with early battery replacement, the battery leasing company can collect a secondary battery with sufficient remaining capacity from the subject vehicle and reuse the collected secondary battery (that is, the used battery) in another application.

The management apparatus can distinguish the subject vehicle based on the management information stored in the storage. The management apparatus can provide services to notify only the user of the subject vehicle of battery replacement timing described above.

For example, a vehicle of a user who agrees with early battery replacement may be defined as the subject vehicle and a vehicle of a user who does not agree with early battery replacement may be defined as a non-subject vehicle. A vehicle on which a used battery is mounted may be defined as the subject vehicle and a vehicle on which a new battery is mounted may be defined as a non-subject vehicle. Effective use of used batteries may be promoted as a vehicle user who contributes to effective use of used batteries is qualified for receiving the services.

The history information may be information that shows a frequency distribution during a prescribed period of at least one of a state of charge (SOC), a charging current, a discharging current, and a temperature of the secondary battery mounted on the subject vehicle.

The SOC, the charging current, the discharging current, and the temperature during the prescribed period of the secondary battery tend to affect a rate of deterioration of the secondary battery. Therefore, use of the history information facilitates highly accurate estimation by the estimator of the management apparatus, of the degree of deterioration of the secondary battery mounted on the subject vehicle.

A vehicle sales system according to a second point of view of the present disclosure includes any management apparatus described above and a dealer terminal which is a computer provided in an automobile distributor. When a vehicle purchaser agrees with post-purchase battery replacement (that is, replacement of a secondary battery mounted on a vehicle at the time when a degree of deterioration of the secondary battery reaches the prescribed threshold value after purchase of the vehicle), the dealer terminal presents to the vehicle purchaser, a sales price lower than when the vehicle purchaser does not agree with post-purchase battery replacement. When a sales-and-purchase contract is completed by approval by the vehicle purchaser to purchase the vehicle at the presented sales price, the dealer terminal transmits contract information showing contents of the sales-and-purchase contract to the management apparatus. The management apparatus updates the management information with the contract information received from the dealer terminal.

In order to promote use of used batteries in a vehicle, the inventor of the present application proposes a new business model (which is also referred to as a "discount sales model" below) for selling a vehicle at a discount price to a vehicle purchaser who agrees with post-purchase battery replacement. A vehicle main body (a portion other than the secondary battery) sold pursuant to this discount sales model is new (unused). The secondary battery combined with the vehicle main body may be a new battery or a used battery. The secondary battery may be sold together with the vehicle main body or may be leased separately from the sold vehicle main body.

In the vehicle sales system, when the vehicle purchaser agrees with post-purchase battery replacement, the dealer terminal provided in an automobile distributor presents to the vehicle purchaser, a sales price lower than when the vehicle purchaser does not agree with post-purchase battery replacement. Post-purchase battery replacement is thus promoted. Post-purchase battery replacement may be done immediately before the end of battery life. As the secondary battery is used in the subject vehicle until immediately before the end of the life, the used battery is effectively used. Post-purchase battery replacement may be done in order to reuse the secondary battery (that is, the used battery) collected from the subject vehicle in another application. As the used battery is reused, effective use of the used battery is promoted.

In the vehicle sales system, when a sales-and-purchase contract of a car is completed, the dealer terminal transmits contract information showing contents of the contract to the management apparatus. The management apparatus can update the management information in conformity with the contract information received from the dealer terminal. Then, the management apparatus can provide services to notify only the user of the subject vehicle indicated in the updated management information of battery replacement timing described above.

The management apparatus may register in the management information as the subject vehicle, the vehicle purchased by the vehicle purchaser who agrees with post-purchase battery replacement. The management apparatus may transmit the notification signal described previously to the dealer terminal. When the dealer terminal receives the notification signal from the management apparatus, it may give a notification to a user of the subject vehicle to invite the user of the subject vehicle to replace the secondary battery.

In the vehicle sales system, since the dealer terminal that has received the notification signal invites the user of the subject vehicle (more specifically, the vehicle purchaser who agrees with post-purchase battery replacement) to replace the battery, battery replacement at appropriate timing is facilitated.

In the vehicle sales system, the vehicle purchased by the vehicle purchaser who agrees with post-purchase battery replacement may be a vehicle on which a used battery is mounted as the secondary battery described previously. Such a vehicle sales system contributes to increase in number of users who use used batteries in vehicles.

The prescribed threshold value may be a degree of deterioration immediately before expiration of life of the used battery in the vehicle. In the vehicle sales system, battery replacement soon after delivery of a vehicle to a vehicle purchaser is not preferred not only from a point of view of effective use of the battery but also from a point of view of convenience of the user. Since the used battery has short life, the user of the vehicle desires to properly determine battery life (for example, a period during which the secondary battery is usable in the vehicle) and to use the battery until immediately before expiration of battery life. A rate of deterioration of the battery, however, varies also depending on how the battery is used. Therefore, it is difficult for the user himself/herself to properly determine battery life (and battery replacement timing). In this regard, according to the vehicle sales system, the notification signal described previously is transmitted from the management apparatus to the dealer terminal at timing immediately before expiration of life of the used battery in the subject vehicle, and the dealer terminal that has received the notification signal gives a notification to the user of the subject vehicle to invite the user of the subject vehicle to replace the battery. Therefore, in the vehicle sales system, the user who has purchased the vehicle on which the used battery is mounted tends to use the secondary battery until immediately before expiration of battery life. As the user who has purchased the vehicle on which the used battery is mounted can receive the services as above, sales of vehicles on which used batteries are mounted may be promoted. Battery life varies depending on an application. Even though life of the used battery in the subject vehicle expires, that used battery may be used in another application. For example, a used battery collected from the subject vehicle may be reused in a vehicle lower in required battery performance than the subject vehicle.

In the vehicle sales system, the management apparatus may determine the prescribed threshold value in accordance with an application after replacement of the secondary battery. According to such a configuration, deterioration of the secondary battery to such an extent as being unusable in a post-replacement application can be suppressed. Therefore, reuse of the secondary battery (that is, the used battery) collected from the subject vehicle in another application is facilitated.

In the vehicle sales system, the dealer terminal may transmit a signal inviting the user of the subject vehicle to replace the secondary battery to at least one of a communication apparatus mounted on the subject vehicle and a portable terminal carried by the user of the subject vehicle.

According to the configuration, the user of the subject vehicle is more likely to notice an incoming signal that invites the user to replace the battery.

In the vehicle sales system, the dealer terminal may provide a quote that presents a first sales price to the vehicle purchaser who does not agree with post-purchase battery replacement and provide a quote that presents a second sales price lower than the first sales price to the vehicle purchaser who agrees with post-purchase battery replacement.

According to the dealer terminal, presentation of the sales price in accordance with agreement/disagreement with post-purchase battery replacement is facilitated.

In the vehicle sales system, the management apparatus may be provided in a data center of an automobile manufacturer.

An automobile manufacturer possesses an enormous amount of data on cars. The automobile manufacturer readily collects data on cars and batteries from distributors and users. Therefore, the management apparatus is suitable for management of the secondary battery usable in the vehicle.

The secondary battery may be mounted on an electrically powered vehicle. The electrically powered vehicle refers to a vehicle that travels with electric power stored in a secondary battery. Examples of the electrically powered vehicle include an electric vehicle (EV), a hybrid vehicle (HV), and a plug-in hybrid vehicle (PHV) as well as a fuel cell vehicle (FC vehicle) and a range extender EV.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is a diagram showing exemplary management information held by the management apparatus according to the embodiment of the present disclosure.

DESCRIPTION OF THE PREFERRED EMBODIMENTS

Figure 1:
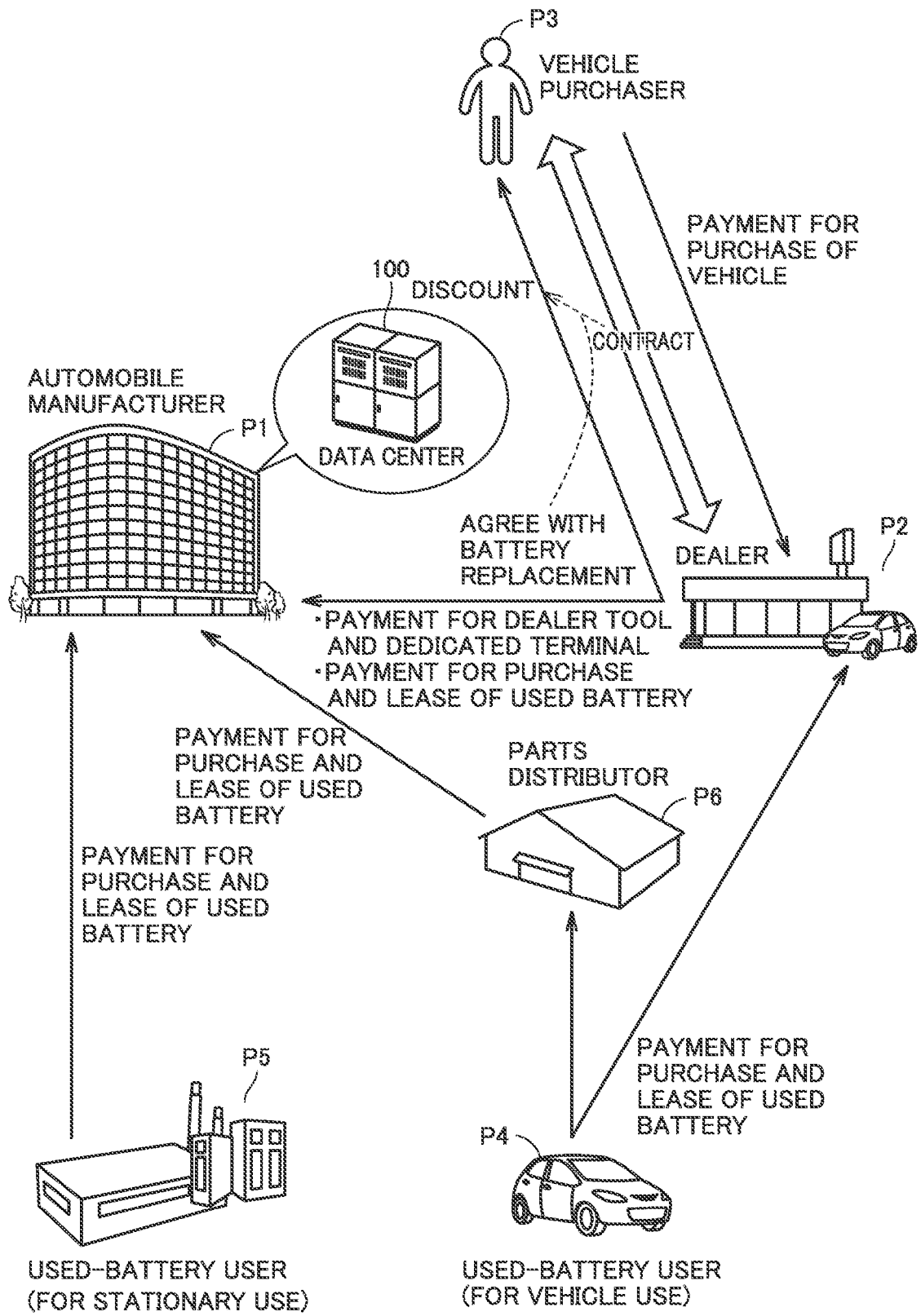
FIG. 1 is a diagram showing overview of a business model realized by a vehicle sales system according to an embodiment of the present disclosure.

An embodiment of the present disclosure will be described in detail with reference to the drawings. The same or corresponding elements in the drawings have the same reference characters allotted and description thereof will not be repeated. A secondary battery is also simply referred to as a "battery" below. A used battery means a used secondary battery. A new battery means an unused secondary battery.

FIG. 1 is a diagram showing overview of a business model realized by a vehicle sales system according to an embodiment of the present disclosure.

Referring to FIG. 1, in this business model, an automobile manufacturer P1 manufactures electrically powered vehicles. Automobile manufacturer P1 procures used batteries usable in the electrically powered vehicles. Automobile manufacturer P1 may procure the used batteries with any method. For example, automobile manufacturer P1 may purchase secondary batteries used in vehicles from vehicle users. In the business model shown in FIG. 1, automobile manufacturer P1 supplies used batteries to each of a dealer P2, a user P5 of a battery for stationary use, and a parts distributor P6, and is paid therefor. Automobile manufacturer P1 may sell or lease used batteries.

Automobile manufacturer P1 sells manufactured vehicles through dealer P2. A server 100 is provided in a data center of automobile manufacturer P1. A communication apparatus (for example, a communication apparatus 17 shown in FIG. 2 which will be described later) capable of communicating with server 100 is mounted on a vehicle manufactured by automobile manufacturer P1. Automobile manufacturer P1 sells a dedicated terminal and a dealer tool capable of communicating with server 100 to dealer P2. The dedicated terminal is a computer including a communication apparatus capable of communicating with server 100. The dealer tool is a device that reads data accumulated in the vehicle manufactured by automobile manufacturer P1 from the vehicle. The dedicated terminal is also referred to as a "dealer terminal" below.

Dealer P2 is an automobile distributor that sells a vehicle manufactured by automobile manufacturer P1 and provides after-sales services (for example, inspection and maintenance). Dealer P2 lays in vehicles from automobile manufacturer P1 and sells the vehicles to a vehicle purchaser P3. Dealer P2 sells a new vehicle (that is, an electrically powered vehicle including both of a new vehicle main body and a new secondary battery) and a used-battery-mounted vehicle (that is, an electrically powered vehicle including a new vehicle main body and a used battery as being combined). Dealer P2 sells a vehicle at a discount to vehicle purchaser P3 who agrees with post-purchase battery replacement.

When vehicle purchaser P3 agrees with post-purchase battery replacement, only the vehicle main body is sold and the secondary battery mounted on the vehicle is leased from dealer P2 to vehicle purchaser P3. In this case, when a degree of deterioration of the secondary battery mounted on the vehicle reaches a prescribed threshold value after purchase of the vehicle, the secondary battery mounted on the vehicle is replaced with another secondary battery. Unless a penalty which will be described later is issued, no fee is charged for lease of the secondary battery during a period until battery replacement.

Vehicle purchaser P3 can select between purchase of a new vehicle and purchase of a used-battery-mounted vehicle. For dealer P2 to appropriately manage the used battery, however, dealer P2 sells the used-battery-mounted vehicle only to vehicle purchaser P3 who agrees with post-purchase battery replacement (that is, replacement of the used battery when the degree of deterioration of the used battery mounted on the vehicle reaches the prescribed threshold value after purchase of the vehicle).

Though details will be described later, dealer P2 obtains at any time with the dealer terminal, history information showing history of use of the secondary battery mounted on the vehicle, in order to ensure performance of the secondary battery after sales of the vehicle. Dealer P2 monitors a state of the secondary battery based on such information. When prescribed battery replacement timing comes, dealer P2 gives to vehicle purchaser P3 who has agreed with post-purchase battery replacement, a notification to invite the vehicle purchaser to replace the battery. A prescribed penalty (for example, a penalty charge) is imposed on vehicle purchaser P3 who fails to replace the battery within a prescribed period from the notification in spite of his/her agreement with post-purchase battery replacement.

In addition to sales of the vehicle described above, dealer P2 also sells and/or leases used batteries. Dealer P2 supplies used batteries to a user P4 of a battery for vehicle use and is paid therefor. User P4 of a battery for vehicle use is, for example, a user who uses a vehicle sold by dealer P2.

User P4 of a battery for vehicle use can also be supplied with used batteries from parts distributor P6. Parts distributor P6 supplies used batteries to user P4 of a battery for vehicle use and is paid therefor. Parts distributor P6 may sell or lease used batteries.

Figure 2:
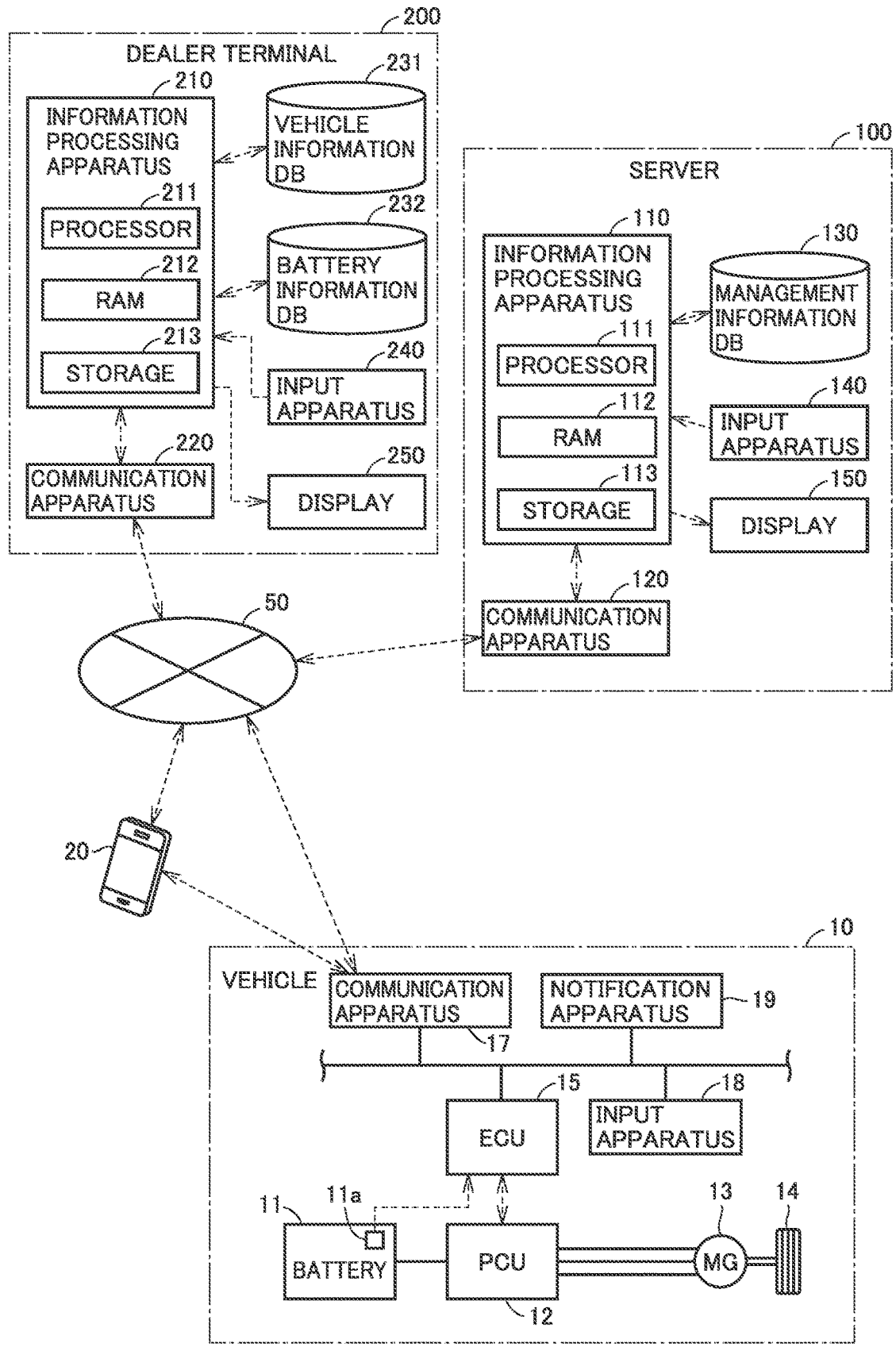
FIG. 2 is a diagram showing a vehicle, a portable terminal, a management apparatus, and a dealer terminal included in the vehicle sales system according to the embodiment of the present disclosure.

FIG. 2 is a diagram showing a vehicle 10, a portable terminal 20, server 100, and a dealer terminal 200 included in the vehicle sales system according to the embodiment of the present disclosure.

Referring to FIG. 2, server 100 is provided in the data center of automobile manufacturer P1 shown in FIG. 1. Server 100 includes an information processing apparatus 110, a communication apparatus 120, a management information database (DB) 130, an input apparatus 140, and a display 150. Server 100 according to this embodiment corresponds to an exemplary "management apparatus" according to the present disclosure.

Management information DB 130 accumulates management information for managing each vehicle in association with a vehicle ID. The management information accumulated in management information DB 130 includes information on each of a plurality of vehicles managed by server 100. The scope of management of the vehicle by server 100 is different for each vehicle. A plurality of vehicles managed by server 100 are categorized into a vehicle for which battery replacement timing is managed by server 100 (which is also referred to as a "subject vehicle" below) and a vehicle for which battery replacement timing is not managed by server 100 (which is also referred to as a "non-subject vehicle" below). The management information stored in management information DB 130 indicates whether or not each vehicle falls under the subject vehicle (see, for example, FIG. 7 which will be described later). Dealer terminal 200 is a computer provided at dealer P2 shown in FIG. 1.

Dealer terminal 200 includes an information processing apparatus 210, a communication apparatus 220, a vehicle information database (DB) 231, a battery information database (DB) 232, an input apparatus 240, and a display 250.

Dealer P2 provides for each sold vehicle, an ID (which is also referred to as a "vehicle ID" below) for identifying the vehicle. Vehicle information DB 231 accumulates information on each vehicle in association with the vehicle ID. Information on the vehicle accumulated in vehicle information DB 231 includes a communication address of communication apparatus 17 mounted on each vehicle and information on the vehicle entered through input apparatus 240. Dealer P2 provides an obtained battery with an ID (which is also referred to as a "battery ID" below) for identifying the battery. The battery ID is thus provided to each battery stored by dealer P2. Battery information DB 232 accumulates information on each battery in association with the battery ID. Information on the battery accumulated in battery information DB 232 includes a battery deterioration degree (a degree of deterioration of the secondary battery) which will be described later and information on the battery entered through input apparatus 240.

In this embodiment, a computer is mounted on each of information processing apparatuses 110 and 210. Information processing apparatuses 110 and 210 include processors 111 and 211, random access memories (RAMs) 112 and 212, and storages 113 and 213, respectively. For example, a central processing unit (CPU) can be adopted as each of processors 111 and 211. Each of storages 113 and 213 can store information that is put thereinto. Each of storages 113 and 213 stores not only a program but also information (for example, a map, a mathematical expression, and various parameters) to be used by a program. Any number of processors may be provided in each of information processing apparatuses 110 and 210 and a processor may be prepared for each prescribed type of processing. Though each of information processing apparatuses 110 and 210 performs processing with software in this embodiment, it may perform processing with dedicated hardware (electronic circuitry) instead of software.

Each of communication apparatuses 120 and 220 can access a communication network 50. Each of communication apparatuses 120 and 220 can communicate with another terminal over communication network 50. Communication apparatuses 120 and 220 are controlled by information processing apparatuses 110 and 210, respectively.

Each of input apparatuses 140 and 240 accepts an input from a user. Input apparatuses 140 and 240 provide signals corresponding to an input from the user to information processing apparatuses 110 and 210, respectively. For example, the user can provide a prescribed instruction or request to information processing apparatuses 110 and 210 through input apparatuses 140 and 240 or can set a parameter value in information processing apparatuses 110 and 210. Various pointing devices (a mouse and a touch pad), a keyboard, or a touch panel can be adopted as each of input apparatuses 140 and 240. Each of input apparatuses 140 and 240 may include a smart speaker that accepts an audio input. In this embodiment, input apparatus 240 includes a dealer tool DT (see FIG. 3) which will be described later.

Displays 150 and 250 show information in response to instructions from information processing apparatuses 110 and 210, respectively. Information processing apparatuses 110 and 210 can give information to a user through displays 150 and 250, respectively. Examples of each of displays 150 and 250 include a cathode ray tube (CRT) display, a liquid crystal display (LCD), and a touch panel display. Each of displays 150 and 250 may include a speaker function.

Vehicle 10 is an electrically powered vehicle sold by dealer P2 (FIG. 1) to vehicle purchaser P3 (FIG. 1). Vehicle purchaser P3 becomes a user of vehicle 10 by purchasing vehicle 10. Vehicle 10 includes a battery 11, a monitoring unit 11a, a power control unit (PCU) 12, a motor generator (MG) 13, a drive wheel 14, an electronic control unit (ECU) 15, a communication apparatus 17, an input apparatus 18, and a notification apparatus 19.

Vehicle 10 converts electric power stored in battery 11 to motive power and can travel with motive power. Vehicle 10 may be an electric vehicle without including an internal combustion engine (not shown) or a hybrid vehicle that includes an internal combustion engine and can travel also with motive power provided from the internal combustion engine. Electric power stored in battery 11 is converted by MG 13 to motive power for driving drive wheel 14.

Battery 11 includes a secondary battery such as a lithium ion battery or a nickel metal hydride battery. The secondary battery may be a battery assembly. In this embodiment, a battery assembly including a plurality of lithium ion batteries is adopted as the secondary battery. The battery assembly is constituted of a plurality of secondary batteries (which are generally also referred to as "cells") electrically connected to one another. When vehicle 10 is a new vehicle, battery 11 is a new battery. When vehicle 10 is a used-battery-mounted vehicle, battery 11 is a used battery. Battery 11 according to this embodiment corresponds to an exemplary "secondary battery" according to the present disclosure.

Monitoring unit 11a includes various sensors that detect a state (for example, a temperature, a current, and a voltage) of battery 11 and provides a result of detection to ECU 15. ECU 15 can obtain a state of battery 11 based on outputs from monitoring unit 11a (detection values from various sensors). Monitoring unit 11a may be a battery management system (BMS) further including a state of charge (SOC) estimation function, a state of health (SOH) estimation function, a cell voltage equalization function, a diagnosis function, and a communication function in addition to the sensor function.

MG 13 is implemented, for example, by a three-phase alternating-current (AC) motor generator. MG 13 is driven by PCU 12 and rotates drive wheel 14. MG 13 can also perform regeneration. Electric power generated by MG 13 is rectified by PCU 12 and battery 11 is charged therewith.

PCU 12 includes an inverter and a converter (neither of which is shown) and drives MG 13 in accordance with a drive signal from ECU 15. PCU 12 converts direct-current (DC) power supplied from battery 11 into AC power during power running drive of MG 13 and rectifies electric power generated by MG 13 and supplies rectified electric power to battery 11 during regeneration of MG 13.

ECU 15 is basically the same in hardware configuration as information processing apparatuses 110 and 210 described previously and includes a processor, a RAM, and a storage. For example, control of vehicle 10 (for example, charging and discharging control of battery 11) is carried out by execution by the processor of a program stored in the storage.

Though not shown, various sensors (a vehicle speed sensor, an odometer, an accelerator position sensor, and an outdoor temperature sensor) that detect a state of vehicle 10 and provide the state to ECU 15 are provided in vehicle 10. While ECU 15 detects the state of vehicle 10 with various sensors, it controls vehicle-mounted devices such that vehicle 10 is in a desired state.

Communication apparatus 17 includes various communication interfaces (I/Fs). Communication apparatus 17 may include a data communication module (DCM). Communication apparatus 17 may include a communication I/F in conformity with 5th Generation Mobile Communication System (5G). ECU 15 can access communication network 50 through wireless communication by controlling communication apparatus 17.

Input apparatus 18 accepts an input from a user. Input apparatus 18 is operated by the user and provides a signal corresponding to the operation by the user to ECU 15. Input apparatus 18 may include a touch panel provided in a vehicle compartment. Input apparatus 18 may include various switches and various buttons provided in a steering wheel or an instrumental panel. Input apparatus 18 may be an operation portion of a car navigation system. Input apparatus 18 may be a smart speaker that accepts an audio input.

Notification apparatus 19 performs prescribed processing for giving a notification to a user when a request is given from ECU 15. Notification apparatus 19 may include at least one of a display apparatus (for example, a touch panel display), a speaker, and a lamp (for example, a malfunction indicator lamp (MIL)). Notification apparatus 19 may be implemented by a meter panel, a head-up display, or a car navigation system.

Portable terminal 20 is carried by a user of vehicle 10. In this embodiment, a smartphone equipped with a touch panel display is adopted as portable terminal 20. Without being limited thereto, any portable terminal can be adopted as portable terminal 20, and a tablet terminal, a wearable device (for example, a smart watch), or an electronic key can also be adopted.

In this embodiment, portable terminal 20 can communicate with communication apparatus 17. Portable terminal 20 and communication apparatus 17 may communicate with each other through short-range communication such as Bluetooth® (for example, direct communication in a vehicle or within an area around the vehicle). Portable terminal 20 can access communication network 50 through wireless communication. A signal exchanged between each of server 100, dealer terminal 200, vehicle 10 (communication apparatus 17), and portable terminal 20 and communication network 50 may be encrypted.

Figure 3:
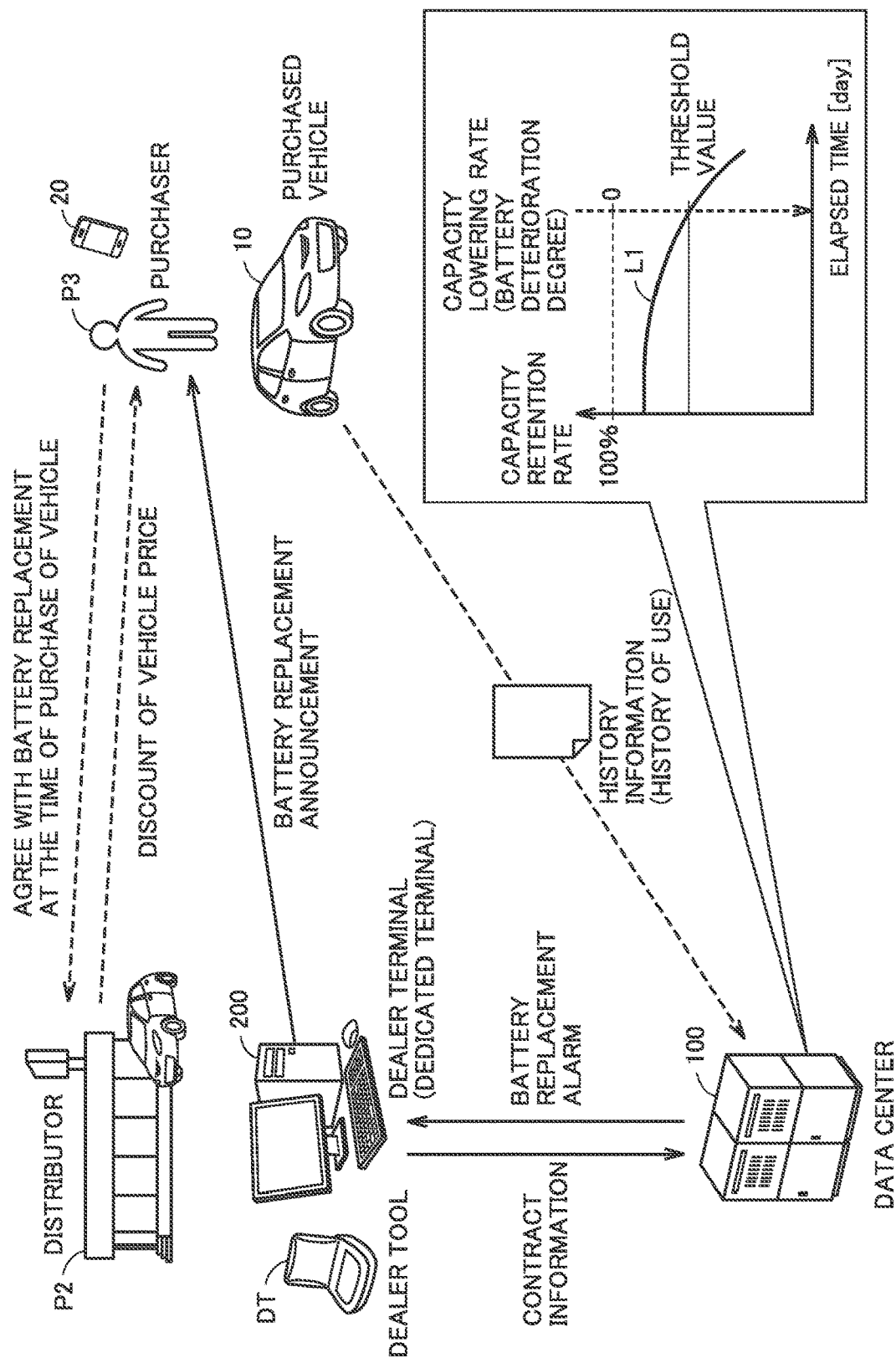
FIG. 3 is a diagram showing an exemplary operation of the vehicle sales system according to the embodiment of the present disclosure.

FIG. 3 is a diagram showing an exemplary operation of the vehicle sales system according to the embodiment of the present disclosure. Referring to FIG. 3 together with FIG. 2, dealer P2 sells any of a new vehicle and a used-battery-mounted vehicle to vehicle purchaser P3. When vehicle purchaser P3 agrees with post-purchase battery replacement, dealer terminal 200 presents to vehicle purchaser P3, a sales price lower than when vehicle purchaser P3 does not agree with post-purchase battery replacement. As vehicle purchaser P3 approves purchase of vehicle 10 at the presented sales price, a sales-and-purchase contract between dealer P2 and vehicle purchaser P3 is completed. When the sales-and-purchase contract is completed, dealer terminal 200 transmits contract information showing contents of the contract to server 100. Details of the contract information will be described later (see FIG. 7). Server 100 updates management information within management information DB 130 with the contract information received from dealer terminal 200. Server 100 registers in management information as the subject vehicle, vehicle 10 purchased by the vehicle purchaser who has agreed with battery replacement.

Vehicle 10 sequentially detects history of use of battery 11 mounted on vehicle 10 and stores history information showing the history of use of battery 11. The history information of battery 11 is accumulated, for example, in the storage of ECU 15. Though details will be described later, the history information of battery 11 in this embodiment includes a frequency distribution during a prescribed period (for example, a histogram) of each of the SOC, the charging current, the discharging current, and the temperature of battery 11 (see FIG. 9). In this embodiment, vehicle 10 periodically transmits the history information of battery 11 to server 100 together with the vehicle ID.

It is not essential, however, for vehicle 10 to transmit history information of battery 11 to server 100. Server 100 may obtain history information of battery 11 in a different way. For example, dealer P2 in this embodiment possesses dealer tool DT that reads data accumulated in vehicle 10 from vehicle 10. In an example where vehicle 10 periodically visits dealer P2, when vehicle 10 is brought to dealer P2, staff at dealer P2 may read data accumulated in vehicle 10 from vehicle 10 with the use of dealer tool DT. Staff at dealer P2 can connect dealer tool DT to vehicle 10 and transfer data (for example, history information of battery 11) from vehicle 10 to dealer tool DT. Dealer tool DT transmits data obtained from vehicle 10 to server 100 together with the vehicle ID.

Server 100 receives from the subject vehicle or dealer tool DT, the vehicle ID of the subject vehicle and history information of battery 11, and estimates the degree of deterioration of battery 11 mounted on the subject vehicle indicated by the vehicle ID, based on the received history information of battery 11. Server 100 periodically (for example, every day) estimates the degree of deterioration of battery 11. In this embodiment, a capacity lowering rate is adopted as a parameter indicating the degree of deterioration of battery 11. The capacity lowering rate is a parameter expressed in an expression "capacity lowering rate=100%− capacity retention rate." The capacity retention rate refers to a ratio of a current capacity of battery 11 to a capacity of battery 11 in an initial state (that is, a state that the battery is not deteriorated). As the capacity retention rate is lower, the capacity lowering rate is higher. In the graph shown in FIG. 3, a line L1 represents transition of the capacity lowering rate (and the capacity retention rate) of battery 11.

When the estimated degree of deterioration (for example, the capacity lowering rate) of battery 11 is equal to or lower than a prescribed threshold value, server 100 transmits a battery replacement alarm to dealer terminal 200. The threshold value shown in FIG. 3 is a threshold value indicating battery replacement timing. The battery replacement alarm is a notification signal indicating arrival of battery replacement timing of the subject vehicle. The battery replacement alarm in this embodiment corresponds to an exemplary "notification signal indicating battery replacement timing of the subject vehicle" according to the present disclosure.

When dealer terminal 200 receives the battery replacement alarm (notification signal) from server 100, it issues a battery replacement announcement (that is, a notification inviting the user of the subject vehicle to replace the battery) to the user of the subject vehicle. In this embodiment, dealer terminal 200 transmits a signal inviting the user of vehicle 10 to replace the battery to portable terminal 20 carried by the user of vehicle 10. When portable terminal 20 receives this signal, it shows a screen inviting the user to replace the battery. A specific example of the screen that invites the user to replace the battery will be described later (see FIG. 10). Portable terminal 20 may give pop-up representation of a message indicating reception of a signal that invites the user to replace the battery. Portable terminal 20 may notify the user of occurrence of the pop-up representation by sound or vibration.

Figure 4:
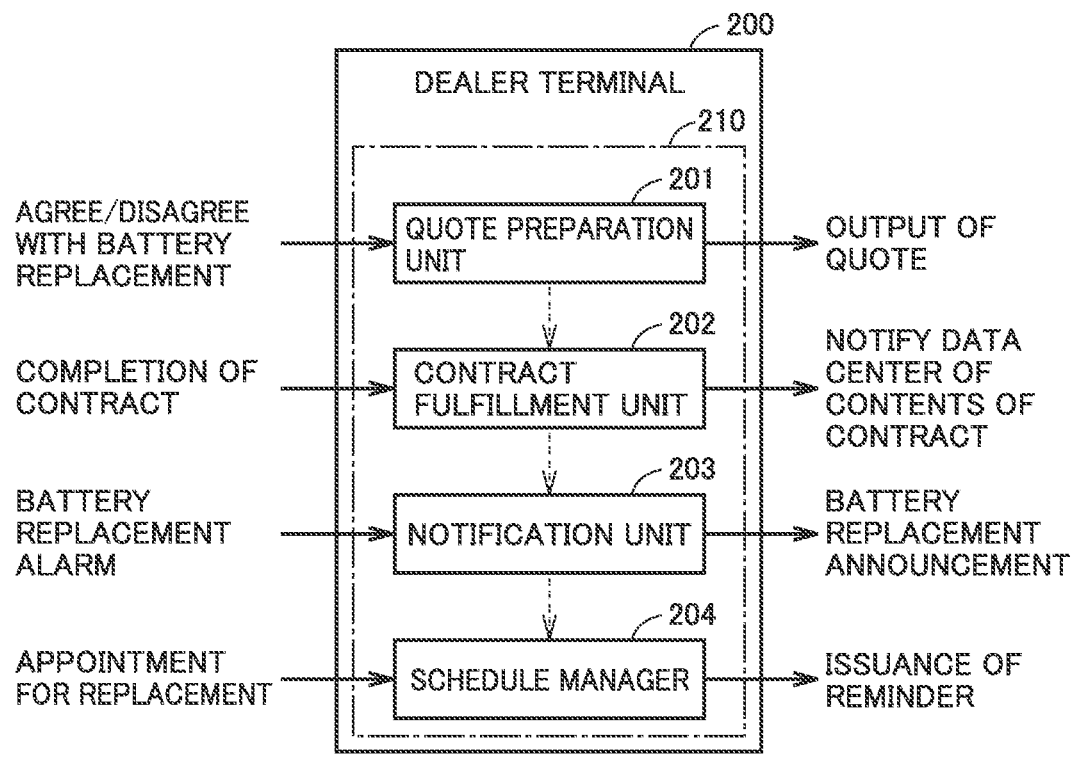
FIG. 4 is a functional block diagram showing a component of a dealer terminal shown in FIG. 2 for each function.

FIG. 4 is a functional block diagram showing a component of dealer terminal 200 for each function. Referring to FIG. 4, information processing apparatus 210 (FIG. 2) of dealer terminal 200 includes a quote preparation unit 201, a contract fulfillment unit 202, a notification unit 203, and a schedule manager 204. In this embodiment, each component is implemented by processor 211 shown in FIG. 2 and a program executed by processor 211 (for example, a program stored in storage 213). Without being limited as such, each component above may be implemented by dedicated hardware (electronic circuitry).

Dealer P2 confirms whether or not the vehicle purchaser agrees with post-purchase battery replacement (that is, replacement of the secondary battery when the degree of deterioration of the secondary battery mounted on the vehicle reaches the prescribed threshold value after purchase of the vehicle). At this time, quote preparation unit 201 may determine the threshold value (FIG. 3) indicating battery replacement timing through processing described below.

Figure 5:
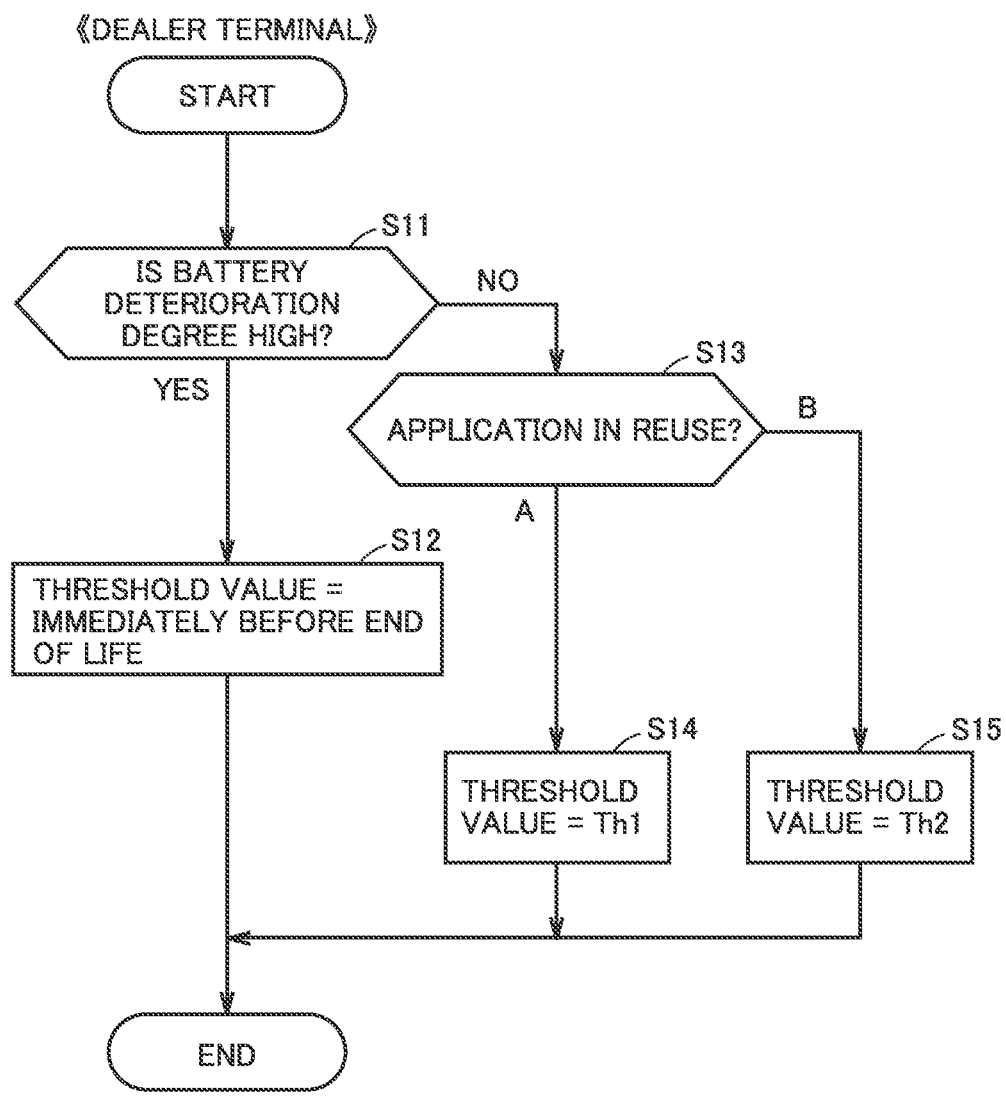
FIG. 5 is a flowchart showing processing involved with determination of a threshold value made by a quote preparation unit shown in FIG. 4.

FIG. 5 is a flowchart showing processing involved with determination of a threshold value made by quote preparation unit 201. Processing shown in this flowchart is started, for example, when staff at dealer P2 gives an instruction to dealer terminal 200 through input apparatus 240.

Referring to FIG. 5 together with FIGS. 2 to 4, in a step (which is simply denoted as "S" below) 11, quote preparation unit 201 determines whether or not the battery deterioration degree (that is, the degree of deterioration of the secondary battery mounted on the vehicle to be sold) is higher than a prescribed value. Quote preparation unit 201 can obtain the battery deterioration degree, for example, from battery information DB 232 (FIG. 2). Alternatively, staff at dealer P2 may enter the battery deterioration degree into information processing apparatus 210 through input apparatus 240.

When the battery deterioration degree is higher than the prescribed value (YES in S11), in S12, quote preparation unit 201 determines as the threshold value (FIG. 3), the degree of deterioration (which is denoted as "ThX" below) immediately before expiration of life of the secondary battery in the vehicle.

When the battery deterioration degree is equal to or lower than the prescribed value (NO in S11), in S13, quote preparation unit 201 determines whether an application after replacement of the secondary battery (that is, an application in reuse of the secondary battery after replacement) is an application A or an application B. An application after replacement of each battery stored at dealer P2 may be registered in advance in battery information DB 232 (FIG. 2). Alternatively, staff at dealer P2 may enter an application (any of application A and application B) after replacement into information processing apparatus 210 through input apparatus 240. When determination as "application A" is made in S13, in S14, quote preparation unit 201 determines a first threshold value (which is denoted as "Th1" below) suitable for application A as the threshold value (FIG. 3). Application A may be, for example, for vehicle use. When determination as "application B" is made in S13, in S15, quote preparation unit 201 determines a second threshold value (which is denoted as "Th2" below) suitable for application B as the threshold value (FIG. 3). Application B may be, for example, for stationary use. When processing in any of S12, S14, and S15 is performed, a series of processing shown in FIG. 5 ends.

Referring again to FIG. 4, quote preparation unit 201 prepares a quote in accordance with agreement/disagreement with post-purchase battery replacement and provides the prepared quote. Dealer P2 presents to the vehicle purchaser, a sales price in accordance with agreement/disagreement with post-purchase battery replacement, in the quote provided by quote preparation unit 201. Specifically, quote preparation unit 201 provides to a vehicle purchaser who does not agree with post-purchase battery replacement, a quote that presents a first sales price and provides to a vehicle purchaser who agrees with post-purchase battery replacement, a quote that presents a second sales price lower than the first sales price. The quote may be provided (for example, printed) on a paper medium or provided as data.

Figure 6:
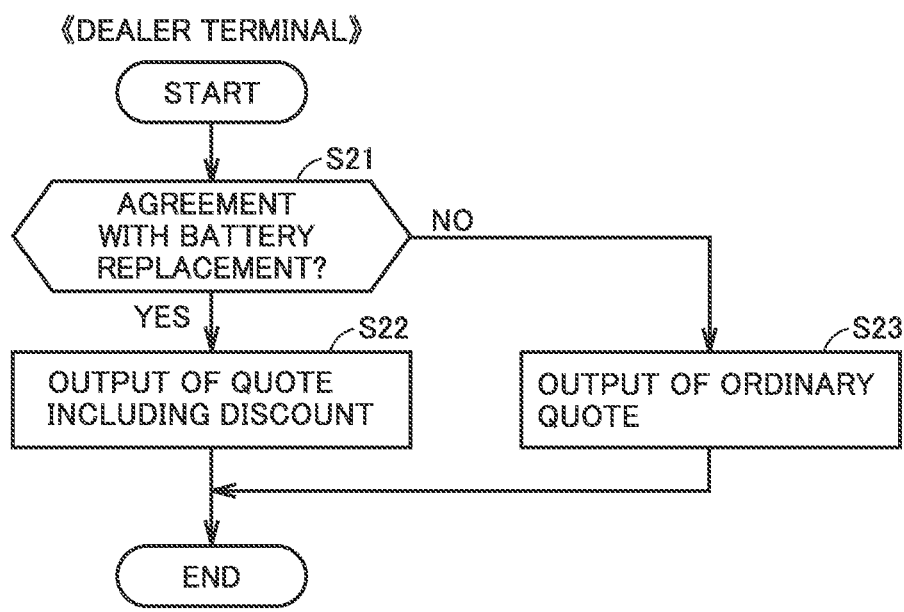
FIG. 6 is a flowchart showing processing involved with output of a quote performed by the quote preparation unit shown in FIG. 4.

FIG. 6 is a flowchart showing processing involved with output of a quote performed by quote preparation unit 201. Processing shown in this flowchart is started, for example, when staff at dealer P2 enters information indicating whether or not the vehicle purchaser has agreed with post-purchase battery replacement into dealer terminal 200 through input apparatus 240.

Referring to FIG. 6 together with FIGS. 2 to 4, in S21, quote preparation unit 201 determines whether or not the vehicle purchaser has agreed with post-purchase battery replacement. Quote preparation unit 201 makes determination in S21, for example, based on information entered by staff at dealer P2.

When the vehicle purchaser has agreed with post-purchase battery replacement (YES in S21), in S22, quote preparation unit 201 prepares and provides a quote including a discount (that is, a quote that presents the second sales price). When the vehicle purchaser does not agree with post-purchase battery replacement (NO in S21), in S23, quote preparation unit 201 prepares and provides an ordinary quote (that is, the quote that presents the first sales price). When processing in any of S22 and S23 is performed, a series of processing shown in FIG. 6 ends.

When the vehicle purchaser purchases a vehicle (for example, a new vehicle) without agreeing with post-purchase battery replacement, in S23, a quote that presents the first sales price is provided. When the vehicle purchaser purchases a vehicle (for example, a new vehicle or a used-battery-mounted vehicle) with agreement with post-purchase battery replacement, in S22, the quote that presents the second sales price is provided. As the vehicle purchaser approves purchase of the vehicle at the sales price presented in the quote, a sales-and-purchase contract between dealer P2 and the vehicle purchaser is completed.

Referring again to FIG. 4, when the sales-and-purchase contract between dealer P2 and the vehicle purchaser is completed, contract fulfillment unit 202 performs processing for fulfilling the contract. In this embodiment, contract fulfillment unit 202 of dealer terminal 200 transmits contract information showing contents of the contract to server 100, together with the vehicle ID of the vehicle involved with the contract (the sold and purchased vehicle).

Server 100 updates management information in management information DB 130 (FIG. 2) with the vehicle ID and the contract information received from dealer terminal 200. Server 100 manages the secondary battery mounted on the vehicle in accordance with the contents of the contract. Management information DB 130 in this embodiment corresponds to an exemplary "storage" according to the present disclosure.

FIG. 7 is a diagram showing exemplary management information held by server 100. Referring to FIG. 7, contract information transmitted from dealer terminal 200 to server 100 includes information on the sold and purchased vehicle (which is also referred to as "contract vehicle information" below), information on the secondary battery mounted on the vehicle (which is also referred to as "contract battery information" below), information indicating whether or not the vehicle purchaser has agreed with post-purchase battery replacement (which is also referred to as "contract replacement information" below), and a threshold value indicating battery replacement timing (which is also referred to as a "contract threshold value" below). In management information, contract information for each vehicle is distinguished based on the vehicle ID.

The contract vehicle information may indicate a model of the sold and purchased vehicle. Categorization of models may follow a catalog from automobile manufacturer P1. Server 100 can obtain specifications of the vehicle based on the model by referring to a vehicle database accumulated in the data center. The contract battery information includes, for example, information (a battery manufacturer, a model number, or a serial number) showing specifications of the secondary battery mounted on the vehicle and a state of deterioration ("0 (no deterioration)" for a new vehicle) of the secondary battery at the time of sales and purchase of the vehicle. The contract threshold value corresponds to the threshold value shown in FIG. 3. The contract threshold value is determined, for example, in the processing shown in FIG. 5, and set only for the vehicle the contract replacement information of which indicates "agreed".

Figure 8:
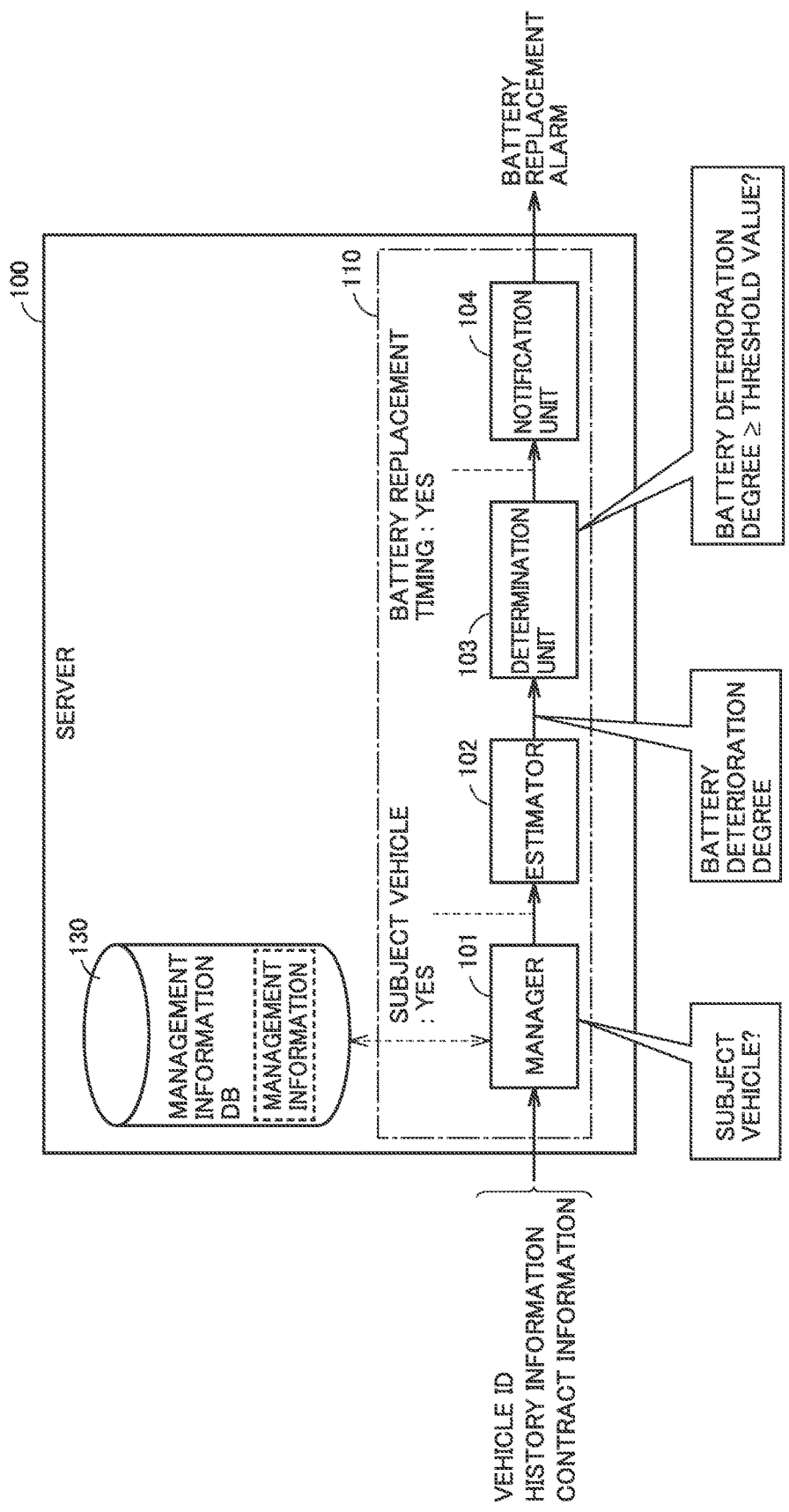
FIG. 8 is a functional block diagram showing a component of the management apparatus according to the embodiment of the present disclosure for each function.

FIG. 8 is a functional block diagram showing a component of server 100 for each function. Referring to FIG. 8, information processing apparatus 110 (FIG. 2) of server 100 includes a manager 101, an estimator 102, a determination unit 103, and a notification unit 104. In this embodiment, each component is implemented by processor 111 shown in FIG. 2 and a program executed by processor 111 (for example, a program stored in storage 113). Without being limited as such, each component above may be implemented by dedicated hardware (electronic circuitry).

Manager 101 updates management information in management information DB 130 (FIG. 2) with contract information received from dealer terminal 200. The management information thus updated indicates whether or not each of a plurality of vehicles managed by server 100 falls under the subject vehicle (the vehicle for which battery replacement timing is managed). Manager 101 can determine whether or not each vehicle falls under the subject vehicle based on the management information (FIG. 7) in management information DB 130. Specifically, the vehicle the contract replacement information of which indicates "agreed" falls under the subject vehicle. Processing by estimator 102, determination unit 103, and notification unit 104 described below is performed periodically (for example, every day) for the subject vehicle.

Estimator 102 estimates the degree of deterioration of battery 11 mounted on the subject vehicle based on history information of battery 11 mounted on the subject vehicle and a state of deterioration of battery 11 at the time of sales and purchase of the subject vehicle (that is, before battery 11 is mounted on the subject vehicle).

Figure 9:
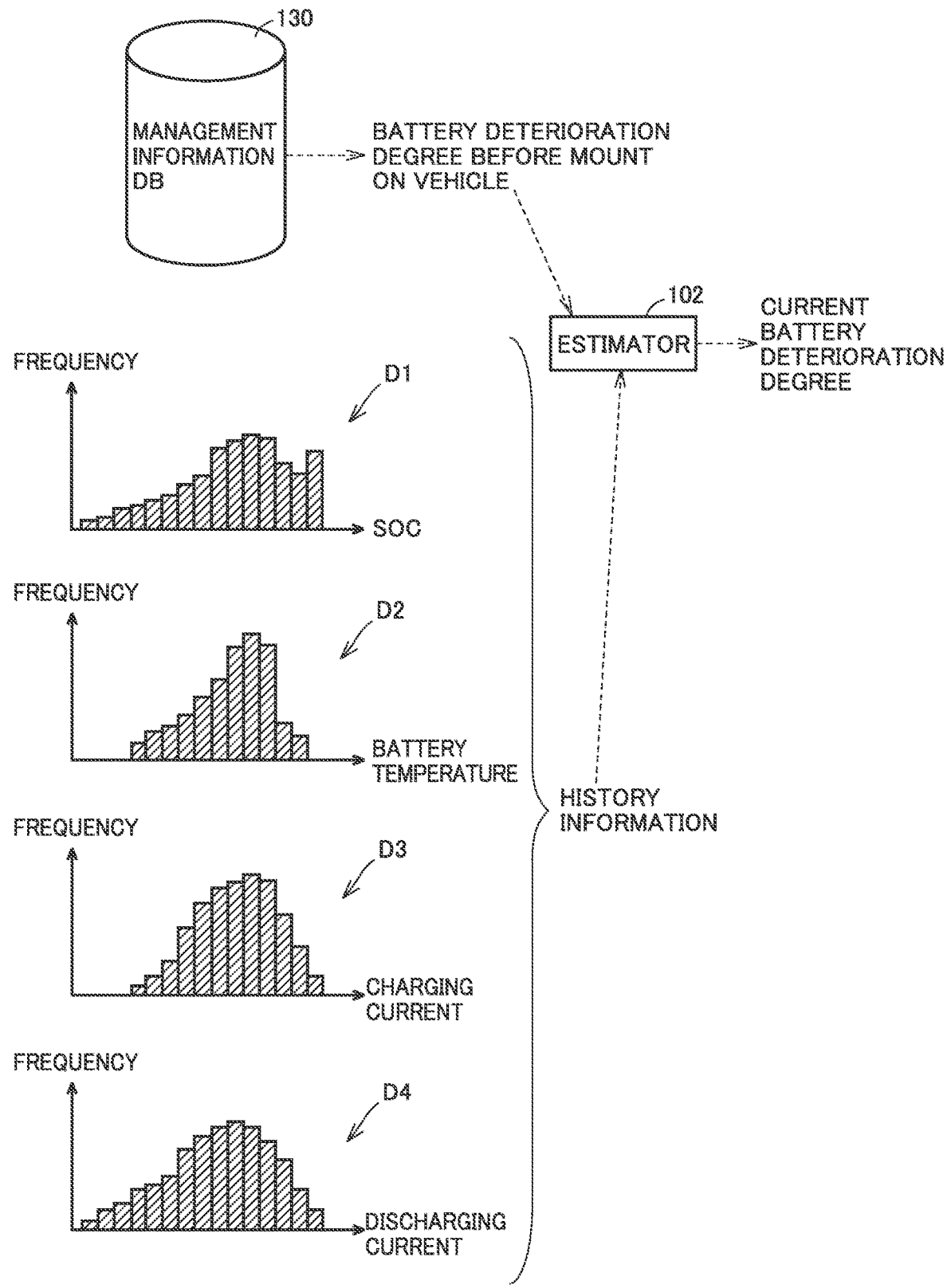
FIG. 9 is a diagram for illustrating processing for estimation of a battery deterioration degree by an estimator shown in FIG. 8.

FIG. 9 is a diagram for illustrating processing for estimation of the battery deterioration degree (the degree of deterioration of battery 11) by estimator 102. Referring to FIG. 9 together with FIG. 2, history information of battery 11 includes a histogram D1 showing a frequency distribution of the SOC of battery 11, a histogram D2 showing a frequency distribution of a battery temperature (the temperature of battery 11), a histogram D3 showing a frequency distribution of the charging current for battery 11, and a histogram D4 showing a frequency distribution of the discharging current from battery 11. Each histogram shows a frequency distribution of the state (that is, the SOC, the temperature, the charging current, and the discharging current) of battery 11 during a prescribed period (for example, a period from mount of battery 11 on the subject vehicle until the current time point).

When the state of deterioration of battery 11 at the time of sales and purchase of the subject vehicle (that is, the degree of deterioration of battery 11 before it is mounted on the subject vehicle) and the history information of battery 11 mounted on the subject vehicle are provided to estimator 102, estimator 102 provides the degree of deterioration of battery 11. Estimator 102 estimates the current degree of deterioration (for example, the capacity lowering rate) of battery 11, for example, by adding an increment in degree of deterioration after mount of battery 11 on the subject vehicle to the degree of deterioration of battery 11 before mount of battery 11 on the subject vehicle. Estimator 102 converts the history information of battery 11 into the degree of deterioration of battery 11 by using conversion information for converting the history information of battery 11 into the degree of deterioration of battery 11 (the increment after mount of battery 11 on the subject vehicle). Examples of the conversion information include a mathematical expression or a map. The conversion information is found in advance, for example, through experiments or simulation and stored in storage 113 (FIG. 2). Storage 113 may store a plurality of types of conversion information. Estimator 102 may select conversion information to be used for estimation in accordance with specifications of battery 11 shown in contract information.

Referring again to FIG. 8, determination unit 103 determines whether or not the battery deterioration degree (the degree of deterioration of battery 11) estimated by estimator 102 is equal to or higher than a contract threshold value. When determination unit 103 makes determination as YES (the battery deterioration degree being equal to or higher than the contract threshold value), notification unit 104 transmits the battery replacement alarm to dealer terminal 200. When determination unit 103 makes determination as NO (the battery deterioration degree being lower than the contract threshold value), notification unit 104 does not transmit the battery replacement alarm.

Referring again to FIG. 4, when notification unit 203 of dealer terminal 200 receives the battery replacement alarm from server 100, it issues a battery replacement announcement (that is, a notification inviting the user of the subject vehicle to replace the battery) to the user of the subject vehicle. Specifically, dealer terminal 200 transmits a signal inviting the user of the subject vehicle to replace the battery to portable terminal 20 carried by the user of the subject vehicle. When portable terminal 20 receives this signal, it shows a battery replacement announcement screen (that is, a screen inviting the user of the subject vehicle to replace the battery). The battery replacement announcement screen is shown on the touch panel display of portable terminal 20. When a user's finger or a pen touches the screen, portable terminal 20 can sense the touched position on the screen. The user can perform an operation over the screen by touching the screen.

Figure 10:
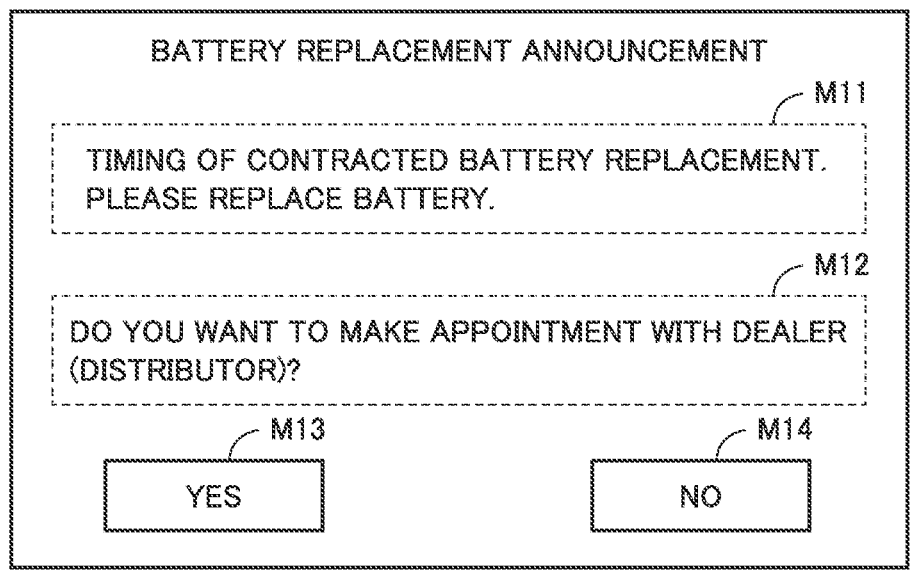
FIG. 10 is a diagram showing an exemplary battery replacement announcement screen shown on the portable terminal in FIG. 2.

FIG. 10 is a diagram showing an exemplary battery replacement announcement screen. Referring to FIG. 10, this screen shows messages M11 and M12, a "YES" button M13, and a "NO" button M14. Message M11 invites the user of the subject vehicle to replace the battery. Message M12 shows explanation about "YES" button M13 and "NO" button M14.

When the user of the subject vehicle presses "YES" button M13, a screen (not shown) for entry of time and date of replacement (that is, time and date of visit to dealer P2 by the user of the subject vehicle for battery replacement) is presented. When the user enters time and date of replacement, the entered time and date of replacement is transmitted from portable terminal 20 to dealer terminal 200. An appointment for replacement is thus made in dealer terminal 200. The time and date of replacement for each vehicle is registered in vehicle information DB 231 (FIG. 2) of dealer terminal 200.

When the user of the subject vehicle presses "NO" button M14, a window showing the battery replacement announcement screen is closed without an appointment for replacement being made.

Referring again to FIG. 4, schedule manager 204 of dealer terminal 200 issues a reminder to the user who has made the appointment for replacement. Schedule manager 204 informs the user of the time and date of the appointment for replacement, for example, in the morning of that day. Alternatively, schedule manager 204 may issue a reminder to the user before expiration of a penalty grace period (that is, time and date when the penalty is awarded due to nonfulfillment of battery replacement).

When the user of the subject vehicle brings the subject vehicle to dealer P2 in response to the battery replacement announcement, the battery is replaced at dealer P2. A secondary battery to be mounted on the subject vehicle in this battery replacement may be determined at the time of completion of the sales-and-purchase contract of the subject vehicle or through negotiation between the user and dealer P2 at the time of battery replacement. The secondary battery to be mounted on the subject vehicle in this battery replacement may be a used battery or a new battery.

The secondary battery collected from the subject vehicle in battery replacement is reused, for example, in a different application. The secondary battery collected from the subject vehicle the contract threshold value of which is Th1 is reused in application A (for example, for vehicle use). The secondary battery collected from the subject vehicle the contract threshold value of which is Th2 is reused in application B (for example, for stationary use). The secondary battery collected from the subject vehicle the contract threshold value is ThX may be thrown away or reused in a different application (for example, for a vehicle lower in required battery performance than the subject vehicle).

As described above, the management apparatus (server 100) according to this embodiment manages the secondary battery mounted on the vehicle. Server 100 includes management information DB 130 that stores management information (see FIG. 7) indicating whether or not each of a plurality of vehicles falls under the subject vehicle for which battery replacement timing is managed. Information processing apparatus 110 (see FIG. 8) of server 100 includes estimator 102 that estimates the degree of deterioration of the secondary battery mounted on the subject vehicle based on history information showing history of use of the secondary battery mounted on the subject vehicle and notification unit 104 that transmits a battery replacement alarm (a notification signal that gives a notification about battery replacement timing of the subject vehicle) when the estimated degree of deterioration of the secondary battery reaches the prescribed threshold value. The vehicle sales system according to this embodiment includes server 100 configured as above and dealer terminal 200. When a vehicle purchaser agrees with post-purchase battery replacement (that is, replacement of the secondary battery when the degree of deterioration of the secondary battery mounted on the vehicle reaches the prescribed threshold value after purchase of the vehicle), dealer terminal 200 (see FIG. 4) presents to the vehicle purchaser, a sales price lower than when the vehicle purchaser does not agree with post-purchase battery replacement, and when a sales-and-purchase contract is completed by approval by the vehicle purchaser to purchase a vehicle at the presented sales price, dealer terminal 200 transmits contract information showing contents of the contract to server 100. Server 100 updates the management information in management information DB 130 with the contract information received from dealer terminal 200. With such a vehicle sales system, the discount sales model (that is, the business model in which a vehicle is sold at a discount to a vehicle purchaser who agrees with post-purchase battery replacement) is suitably realized and effective use of used batteries usable in vehicles is promoted.

In the embodiment, when the used battery high in degree of deterioration is mounted on the vehicle, the contract threshold value is set to ThX (that is, the degree of deterioration immediately before expiration of life of the secondary battery in the vehicle) through the processing shown in FIG. 5. The battery replacement announcement described previously is issued to such a user who purchased the used-battery-mounted vehicle, at timing immediately before expiration of life of the used battery. Therefore, with the vehicle sales system, use of the used battery until immediately before expiration of battery life by the user of the usedbattery-mounted vehicle is facilitated. As the user who purchased the used-battery-mounted vehicle can receive services as above, sales of the used-battery-mounted vehicle may be promoted.

In the embodiment, a user who purchases a new vehicle can also receive services of the battery replacement announcement described above by agreeing with post-purchase battery replacement. In this case, the contract threshold value is set to Th1 or Th2 through the processing shown in FIG. 5, and the secondary battery (used battery) collected from the vehicle is reused in application A or application B. Therefore, effective use of the used battery used in the vehicle is promoted.

In the embodiment, the contract threshold value is determined in the processing shown in FIG. 5. Without being limited as such, the contract threshold value may be determined in any manner. For example, dealer P2 may ask vehicle purchaser P3 to reach agreement about setting as the contract threshold value, of the degree of deterioration at which the secondary battery is to be collected. Alternatively, the contract threshold value may be determined in discussion between dealer P2 and vehicle purchaser P3.

In the embodiment, dealer terminal 200 transmits a signal inviting the user of the subject vehicle to replace the battery, to portable terminal 20 carried by the user of the subject vehicle. Without being limited as such, dealer terminal 200 may transmit a signal inviting the user of the subject vehicle to replace the battery, to communication apparatus 17 mounted on the subject vehicle, instead of or in addition to portable terminal 20.

In the embodiment, the battery replacement alarm is transmitted from server 100 to the user of the subject vehicle via dealer terminal 200. Without being limited as such, the battery replacement alarm may directly be transmitted from server 100 to the user of the subject vehicle.

The battery replacement alarm in the embodiment is a notification signal indicating arrival of battery replacement timing of the subject vehicle when the battery replacement timing of the subject vehicle comes. Instead of such a battery replacement alarm, a notification signal indicating battery replacement timing of the subject vehicle before the battery replacement timing of the subject vehicle comes (that is, a notification signal predicting arrival of battery replacement timing) may be adopted.

The configuration of the vehicle is not limited to the configuration shown in FIG. 2. The vehicle may be a passenger car, a bus, or a truck. The vehicle may wirelessly be chargeable. The vehicle may be capable of driverless travel, by autonomous driving or remote driving. The vehicle may be an automated guided vehicle (AGV) or a mobility as a service (MaaS) vehicle managed by a MaaS company.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A system comprising:
a management apparatus;
a dealer terminal that is a computer that provides for each sold vehicle a vehicle ID that identifies the sold vehicle, wherein the management apparatus comprises:
a processor; and
a storage that stores management information;
the dealer terminal is configured to:
determine whether a vehicle purchaser has agreed to post-purchase battery replacement when the vehicle purchaser purchases a vehicle including a secondary battery, the post-purchase battery replacement being replacement of the secondary battery when a degree of deterioration of the secondary battery reaches a prescribed threshold value after purchase of the vehicle,
present a first sales price to the vehicle purchaser when the vehicle purchaser does not agree to the post-purchase battery replacement,
present a second sales price lower than the first sales price to the vehicle purchaser when the vehicle purchaser has agreed to the post-purchase battery replacement, and
transmit contract information showing contents of a sales-and-purchase contract to the management apparatus when the vehicle purchaser approves purchase of the vehicle, and
the management apparatus is configured to:
update the management information that is stored in the storage with the contract information received from the dealer terminal, the management information including the contract information for each sold vehicle distinguished from each other based on the vehicle ID, the contract information including contract replacement information indicating whether each sold vehicle is a subject vehicle, the subject vehicle being a vehicle purchased by a vehicle purchaser who has agreed to the post-purchase battery replacement, and
determine whether each of a plurality of vehicles managed by the management apparatus is the subject vehicle based on the contract replacement information; and
the subject vehicle, wherein
the subject vehicle includes a monitoring unit configured to monitor the secondary battery mounted on the subject vehicle to obtain and store in memory history information showing history of use of the secondary battery, the history information showing a frequency distribution during a prescribed period of at least one of an SOC, a charging current, a discharging current, and a temperature of the secondary battery mounted on the subject vehicle,
the history information stored in the memory of the subject vehicle is transmitted to the management apparatus,
the management apparatus is configured to periodically estimate a degree of deterioration of the secondary battery mounted on the subject vehicle based on the history information,
the management apparatus is configured to, in response to the degree of deterioration of the secondary battery being estimated, compare the degree of deterioration of the secondary battery to the prescribed threshold value,
when the management apparatus determines that the degree of deterioration of the secondary battery that has been estimated reaches the prescribed threshold value, the management apparatus is configured to transmit a notification signal indicating battery replacement timing of the subject vehicle to the dealer terminal, and the dealer terminal is configured to, when the dealer terminal receives the notification signal from the management apparatus, transmit a signal inviting a user of the subject vehicle to replace the secondary battery to at least one of a communication apparatus mounted on the subject vehicle and a portable terminal carried by the user of the subject vehicle, which causes an invitation message to be displayed on a display screen of the communication apparatus.

2. The system according to claim 1, wherein
the dealer terminal is configured to:
  determine whether the degree of deterioration of the secondary battery mounted on the vehicle to be sold is higher than a prescribed value before purchase of the vehicle, and
  determine, when the degree of deterioration of the secondary battery mounted on the vehicle to be sold is higher than the prescribed value, the prescribed threshold value to correspond to a degree of deterioration immediately before expiration of life of the secondary battery.

3. The system according to claim 2, wherein
the dealer terminal is configured to:
  determine, when the degree of deterioration of the secondary battery mounted on the vehicle to be sold is lower than the prescribed value, whether an application in reuse of the secondary battery after replacement is a first application or a second application,
  determine, when the application in reuse of the secondary battery after replacement is the first application, the prescribed threshold value to correspond to a first threshold value suitable for the first application, and
  determine, when the application in reuse of the secondary battery after replacement is the second application, the prescribed threshold value to correspond to a second threshold value suitable for the second application.

4. The system according to claim 3, wherein
the first application is for vehicle use, and
the second application is for stationary use.

5. The system according to claim 1, wherein
the dealer terminal is configured to:
  provide a quote that presents the first sales price to the vehicle purchaser who does not agree to the battery replacement, and
  provide a quote that presents the second sales price to the vehicle purchaser who agrees to the battery replacement.

6. The system according to claim 1, wherein
the management apparatus manages a plurality of vehicles sold by the dealer terminal, the plurality of vehicles including a new vehicle and a used-battery-mounted vehicle, the new vehicle being an electrically powered vehicle including both a new vehicle main body and a new secondary battery, the used-battery-mounted vehicle being an electrically powered vehicle including a new vehicle main body and a used secondary battery.

7. The system according to claim 1, wherein
the history information includes:
  a first histogram showing a frequency distribution of the SOC of the secondary battery mounted on the subject vehicle;
  a second histogram showing a frequency distribution of the temperature of the secondary battery mounted on the subject vehicle;
  a third histogram showing a frequency distribution of the charging current for the secondary battery mounted on the subject vehicle; and
  a fourth histogram showing a frequency distribution of the discharging current from the secondary battery mounted on the subject vehicle.

8. The system according to claim 1, wherein
when the dealer terminal receives the notification signal from the management apparatus, the dealer terminal transmits a battery replacement signal to the portable terminal carried by the user of the subject vehicle, the portable terminal including a touch panel display,
when the portable terminal receives the battery replacement signal, the touch panel display shows a screen for receiving input by the user, and
when the user inputs time and date of replacement into the touch panel display, the portable terminal transmits the time and date of replacement to the dealer terminal.

9. The system according to claim 8, wherein
when the dealer terminal receives the time and date of replacement, an appointment for replacement is made in the dealer terminal, and
the dealer terminal is configured to issue a reminder to the user who has made the appointment for replacement based on the time and date of replacement.

* * * * *